(12) United States Patent
Watanabe (10) Patent No.: US 10,236,436 B2
(45) Date of Patent: Mar. 19, 2019

(54) ELEMENT MANUFACTURING METHOD

(71) Applicant: KYOCERA Corporation, Kyoto-shi, Kyoto (JP)

(72) Inventor: Keiichiro Watanabe, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 15/719,630

(22) Filed: Sep. 29, 2017

(65) Prior Publication Data

US 2018/0047890 A1    Feb. 15, 2018

Related U.S. Application Data

(63) Continuation of application No. PCT/JP2016/060158, filed on Mar. 29, 2016.

(30) Foreign Application Priority Data

Mar. 30, 2015   (JP) ................................. 2015-068813

(51) Int. Cl.
| | | |
|---|---|---|
| *B44C 1/22* | (2006.01) | |
| *H01L 41/29* | (2013.01) | |
| *H01L 41/332* | (2013.01) | |
| *H01L 41/338* | (2013.01) | |
| *H03H 3/02* | (2006.01) | |
| *H03H 9/19* | (2006.01) | |

(52) U.S. Cl.
CPC ............ *H01L 41/29* (2013.01); *H01L 41/332* (2013.01); *H01L 41/338* (2013.01); *H03H 3/02* (2013.01); *H03H 9/19* (2013.01)

(58) Field of Classification Search
CPC . H01L 41/29; H01L 41/338; H01L 21/67075; H01L 21/6704
USPC ................................... 216/57, 59, 60, 84, 85
See application file for complete search history.

(56) References Cited

U.S. PATENT DOCUMENTS

2003/0176069 A1*  9/2003 Yuasa ............... H01J 37/32192
                                                              438/692
2007/0053389 A1   3/2007 Sato et al.
(Continued)

FOREIGN PATENT DOCUMENTS

| JP | 2002-122471 A | 4/2002 |
|----|---------------|--------|
| JP | 2004-191079 A | 7/2004 |

(Continued)

OTHER PUBLICATIONS

International Search Report, PCT/JP2016/060158, dated Jun. 21, 2016, 2 pgs.

*Primary Examiner* — Binh X Tran
(74) *Attorney, Agent, or Firm* — Volpe and Koenig, P.C.

(57) ABSTRACT

An element manufacturing method includes a first step of obtaining a thickness distribution in a planar direction of a workpiece, a second step of calculating a processing amount distribution from a difference between the thickness distribution and a desired film-thickness distribution, a third step of locally processing the workpiece in accordance with the processing amount distribution, a fourth step of, after the third step, dividing an inside of a plane of the workpiece into a plurality of element parts and forming an electrode in each of the element parts, and a fifth step of making the plurality of element parts apart from each other to form a plurality of elements.

16 Claims, 6 Drawing Sheets

(56) References Cited

U.S. PATENT DOCUMENTS

| | | | | |
|---|---|---|---|---|
| 2010/0120228 A1* | 5/2010 | Saito | .................. | B23K 26/0604 |
| | | | | 438/463 |
| 2011/0234052 A1* | 9/2011 | Amano | .................... | H03H 3/02 |
| | | | | 310/344 |
| 2011/0294233 A1* | 12/2011 | Nakata | ...................... | B24B 1/00 |
| | | | | 438/7 |
| 2014/0113390 A1* | 4/2014 | Ploessl | ................ | H01L 33/0095 |
| | | | | 438/16 |

FOREIGN PATENT DOCUMENTS

| | | | |
|---|---|---|---|
| JP | 2006-093865 A | 4/2006 | |
| JP | 2007-068113 A | 3/2007 | |
| JP | 2010-147963 A | 7/2010 | |
| JP | 2011-228931 A | 11/2011 | |

\* cited by examiner

ELEMENT MANUFACTURING METHOD

CROSS-REFERENCE TO RELATED APPLICATIONS

This is a continuation-in-part application of International Application No. PCT/JP2016/060158, filed on Mar. 29, 2016, which claims priority to Japanese Patent Application No. 2015-068813, filed on Mar. 30, 2015. The contents of these applications are incorporated herein by reference in their entirety.

TECHNICAL FIELD

The present disclosure relates to a element manufacturing method manufacturing elements.

BACKGROUND ART

At the formation of elements from a substrate, sometimes variation arises in the characteristics of the elements due to the distribution of thickness of the substrate. As an example of such elements, for example a crystal vibrator can be illustrated. A crystal vibrator is provided with a frequency characteristic corresponding to the thickness of a quartz substrate. The thickness of this substrate has a distribution in the planar direction (in-plane distribution). The in-plane distribution (variation) of the thickness of the substrate is directly connected to variation of the frequency characteristic. Therefore, uneven characteristics have been adjusted by the shape, thickness, etc. of the electrodes formed on the substrate, or pieces obtained by breaking down the substrate have been sorted according to their thicknesses so as not to cause variation of characteristics before forming elements (see for example Japanese Patent Publication No. 2006-93865A and Japanese Patent Publication No. 2004-191079A).

SUMMARY OF INVENTION

A element manufacturing method according to one embodiment of the present disclosure includes a first step, second step, third step, fourth step, and fifth step. The first step is one which obtains a thickness distribution in a planar direction of a workpiece including a reference surface, that is, a film-thickness distribution acquisition step. The second step is one which calculates a processing amount distribution from a difference between the thickness distribution and a desired film-thickness distribution, that is, a processing amount distribution acquisition step. The third step is one which locally processes the workpiece in accordance with the processing amount distribution, that is, a local processing step. The fourth step is one which, after the third step, divides a plane of the workpiece into a plurality of element parts and forms an electrode in each of the element parts, that is, an electrode forming step. The fifth step is one which makes the plurality of element parts apart from each other to form a plurality of elements, that is, a singulation step.

DESCRIPTION OF EMBODIMENTS

First Embodiment

An embodiment of the element manufacturing method of the present disclosure will be explained with reference to the drawings.

Figure 1:
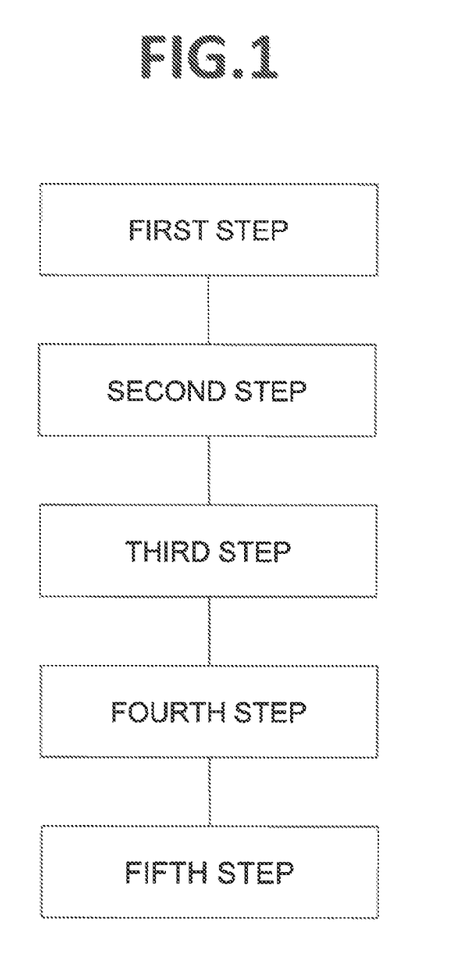
FIG. 1 is a flow chart of a element manufacturing method according to a first embodiment.

FIG. 1 is a flow chart showing steps of a element manufacturing method. FIGS. 2A to 2D are cross-sectional views showing steps in the middle of manufacturing of the elements. FIGS. 3A to 3B are top views showing steps on the middle of manufacturing of the elements. Note that, these views are schematic ones for explanation and do not reflect the actual dimensions and ratios. As shown in FIG. 1, the element manufacturing method includes a first step, second step, third step, fourth step, and fifth step.

Before the first step, a workpiece 100 is prepared. The workpiece 100 has a reference surface. As the workpiece 100, for example, a silicon (Si) or other semiconductor substrate, quartz crystal, a lithium tantalate substrate (LT substrate), lithium niobate substrate (LN substrate), or other piezoelectric substrate, a sapphire substrate or other single crystal insulation substrate, silicon carbide (SiC), and other various substrates can be used. In the case of such a substrate state, the upper surface or lower surface of the substrate becomes the reference surface. In this example, as the workpiece 100, use is made of a crystal wafer formed by slicing a raw stone of an artificial quartz crystal at a desired cutting angle by a multiwire saw etc. After slicing, it may be polished. As such a crystal wafer, one having a diameter of 2 inches and thickness of 20 μm to 200 μm can be illustrated.

Thickness distribution information in the planar direction is acquired for the workpiece 100 prepared in this way in the first step. To measure the thickness distribution, use can be made of a contact type surface shape measurement method, a film-thickness measurement method using optical interference light, or the like. In the present example, use is made of a quartz crystal as the workpiece 100, therefore the film thickness may be calculated by clamping the workpiece 100 in the thickness direction by two electrodes and measuring a resonance frequency.

Next, in the second step, it is possible to calculate a difference of the actual thickness distribution relative to the desired film-thickness distribution in the plane to obtain the in-plane distribution of the amount of processing (below, referred to as the "processing amount distribution"). In this example, the object is to make the film thickness of the workpiece 100 constant in the plane, therefore the desired film-thickness distribution in the plane becomes a constant value. Specifically, in a case making the resonance frequency 10 MHz to 80 MHz when forming the element as the final product, a specified value in a range from 20 μm to 170 μm is targeted as a thickness after machining of the workpiece 100.

Figure 2A:
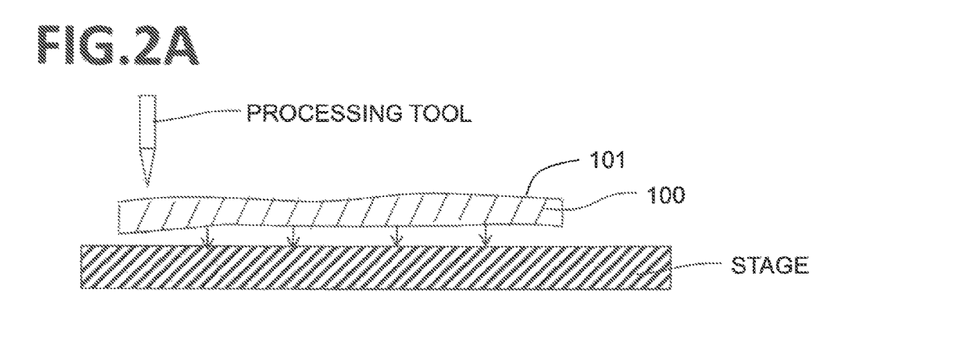
FIGS. 2A, 2B, 2C and 2D are cross-sectional views showing steps of the element manufacturing method according to the first embodiment.
Figure 3A:
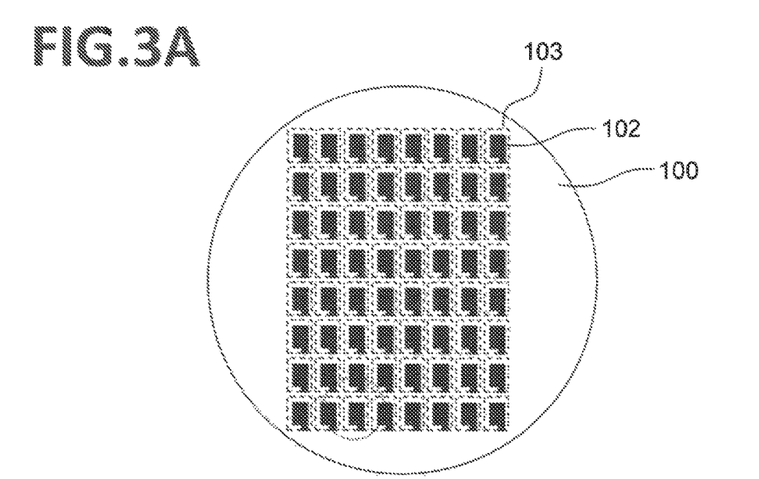
FIGS. 3A and 3B are plan views showing states of a workpiece on the middle of manufacturing by the element manufacturing method according to the first embodiment.
Figure 3B:
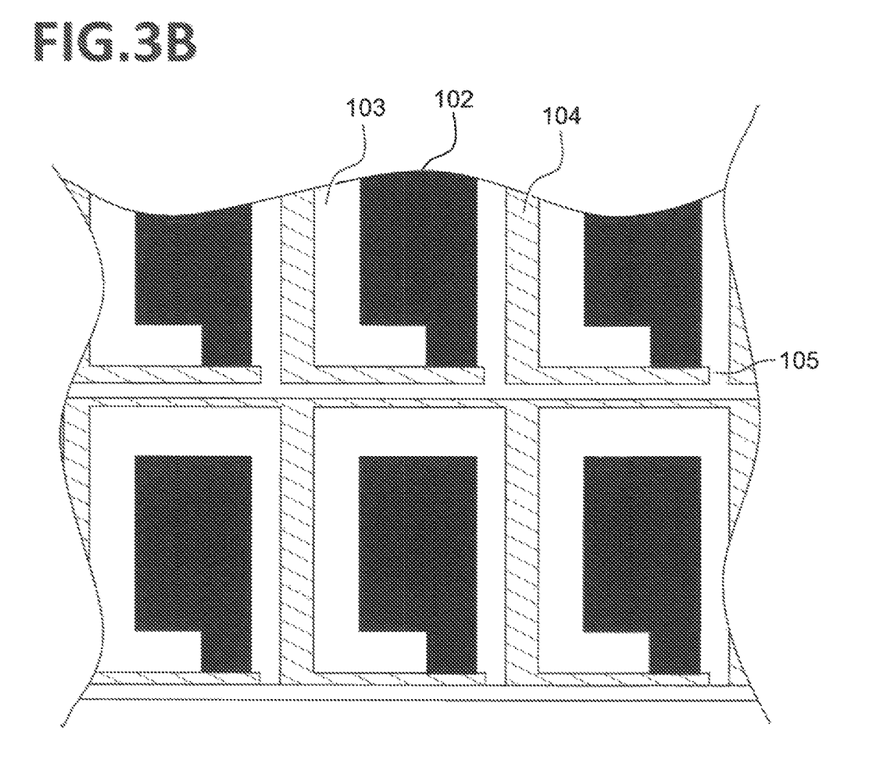

Based on this processing amount distribution, the third step is carried out as shown in FIG. 2A. After this third step, the film-thickness distribution in the plane of the workpiece 100 becomes the desired film-thickness distribution (in this example, a constant film-thickness distribution). The "local machining" may be one locally removing part of the workpiece 100 from the surface or one locally forming a film on the surface.

As such a local processing method used in the third step, the technique is not particularly limited so far as each very small area can be processed with a high precision (for example a variation σ of 5 nm or less). Local polishing, LWE (local wet etching), gas cluster ion beam, EEM (elastic emission machining), local plasma machining, and so on can be illustrated. For example, as examples of local plasma machining, plasma jet, plasma CVM (chemical vaporization machining), PACE (plasma assisted chemical etching), atmospheric pressure plasma machining, etc. can be illustrated. In this example, atmospheric pressure plasma machining is used to process the workpiece 100 from one major surface 101 side so as to obtain the desired thickness distribution. The workpiece 100 is held so as to closely contact the stage. Further, one major surface 101 of the workpiece 100 is scanned by the processing tool. Note that, this atmospheric pressure air plasma machining will be explained later.

Figure 2B:
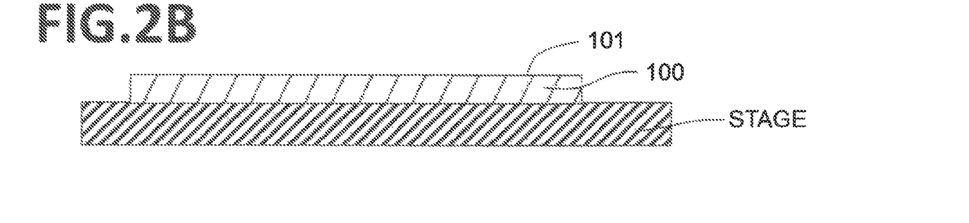
Figure 2C:
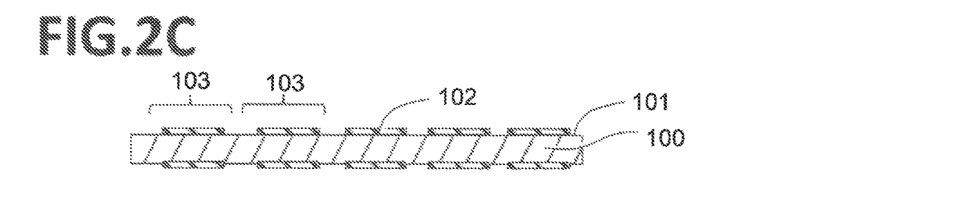

After this third step, the workpiece 100 becomes a uniform thickness as shown in FIG. 2B. Further, in the fourth step after this, electrodes 102 are formed on at least one major surface 101 of the workpiece 100 to thereby produce the elements. When producing crystal vibrators as the elements, as shown in FIG. 2C, electrodes 102 which are arranged facing each other sandwiching the workpiece 100 therebetween may be formed on the two major surfaces of the workpiece 100. Such electrodes 102 may be formed by forming conductive films by vapor deposition, CVD, sputtering, or other usual thin film forming method, then patterning the films to form electrodes having the desired shapes.

Here, a plurality of electrodes 102 may be formed on the workpiece 100 all together so that a plurality of elements can be simultaneously produced from the workpiece 100. Specifically, as shown in FIG. 3A, the workpiece 100 is divided so that the plurality of element parts 103 are aligned in a row direction and column direction in the planar direction. Further, the electrode 102 is formed in each of the element parts 102 of the workpiece 100.

Figure 2D:
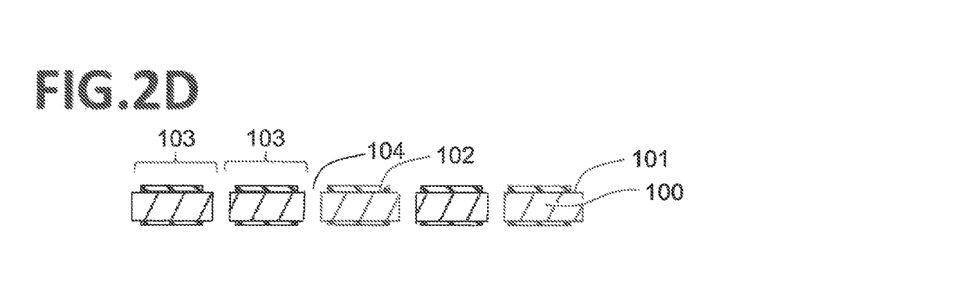

Further, in the fifth step, as shown in FIG. 2D and FIG. 3B, a through hole 104 surrounding each element part 103 is formed while leaving a connecting part 105. Note that, FIG. 3B enlarges a region corresponding to the portion surrounded by a broken line circle in FIG. 3A. The through holes 104 can be formed by forming a mask covering the element parts 103 and connecting parts 105 on one major surface 101, then removing the portions exposed from the mask by etching. Further, mechanical, chemical, or physical means is used to cut away the element parts 103 from the connecting parts 105, and thereby a plurality of elements 110 can be obtained. As the mechanical means, the technique of applying stress to the connecting parts 105 to break the connecting parts 105 or cutting them can be illustrated. As the chemical means, the technique of removing the connecting parts 105 by wet etching or the like can be illustrated. As the physical means, the technique of removing the connecting parts 105 by sputtering or by plasma machining or the like such as used in the third step can be illustrated.

In this example, quartz crystal is used as the workpiece 100, therefore the substrate was broken down into pieces according to the techniques explained above, but when using an Si substrate or LT substrate etc., the substrate may broken down by dicing etc. as well.

Further, in the example described above, the through holes 104 were formed after forming the electrodes 102. However, the electrodes 102 may be formed after forming the through holes 104 as well.

The thickness of the workpiece 100 in each element part 103 can be controlled to a desired value before formation of the electrodes 102 etc. in the element parts 103 as explained above, therefore it becomes unnecessary to design each element part 103 individually, so the elements 110 can be produced with a high productivity. Specifically, the thickness of the workpiece 100 (substrate) is constant among the element parts 103, so after breaking down the substrate to element sizes, it becomes unnecessary to sort the pieces into classes of different thicknesses of the broken down chips and design electrodes with different electrode areas and thicknesses etc. for the different classes. Further, even in a case of forming the electrodes 102 all together before the breaking down the substrate, it becomes unnecessary to design the electrodes 102 with different electrode areas and electrode thicknesses for the different elements 110. Further, an adjustment step removing parts of the thicknesses of the electrodes 102 while measuring the characteristics of the elements 110 in a state mounted in packages to adjust them to the desired characteristics also becomes unnecessary. Due to the above, the productivity can be rapidly raised. Further, the thicknesses of the workpieces 100 are made constant, therefore the respective characteristics of the elements 110 become stable, so a element manufacturing method having a high reliability can be provided.

Note that, in this example, the explanation was given with reference to the example of a case where the electrodes 102 were formed before the breaking down the workpiece 100 into pieces in order to raise the productivity more, but the electrodes 102 may also be formed after the breaking down the workpiece 100 into pieces. Even in that case, the step of sorting the broken down chips according to their thicknesses becomes unnecessary, therefore the productivity can be raised.

<Third Step>

In the broad region of the surface of the workpiece 100 as explained above, control of the thickness of each small region of the element parts 103 to a desired value can be realized first by using the a local processing means. Below, the case of using one of the means, that is, atmospheric pressure plasma machining, will be explained in detail.

Atmospheric pressure plasma machining is a method utilizing plasma generated under atmospheric pressure. Atmospheric pressure plasma machining supplies a process gas to predetermined electrodes to which a high frequency voltage is applied to generate radicals based on the process gas together with the atmospheric pressure plasma and process the processed surface by removing a substance formed a radical reaction between the radicals and the processed surface.

Note that, here, the term "atmospheric pressure" is pressure compared with a pressure inside a chamber of a general vacuum apparatus and does not designate a strict 1 atm. For example, not only a case of fluctuation of air pressure according to the weather, but also a case of fluctuation of air pressure due to installing the processing apparatus in a room which is reduced in pressure from atmospheric pressure and other cases are included in "atmospheric pressure".

Figure 4:
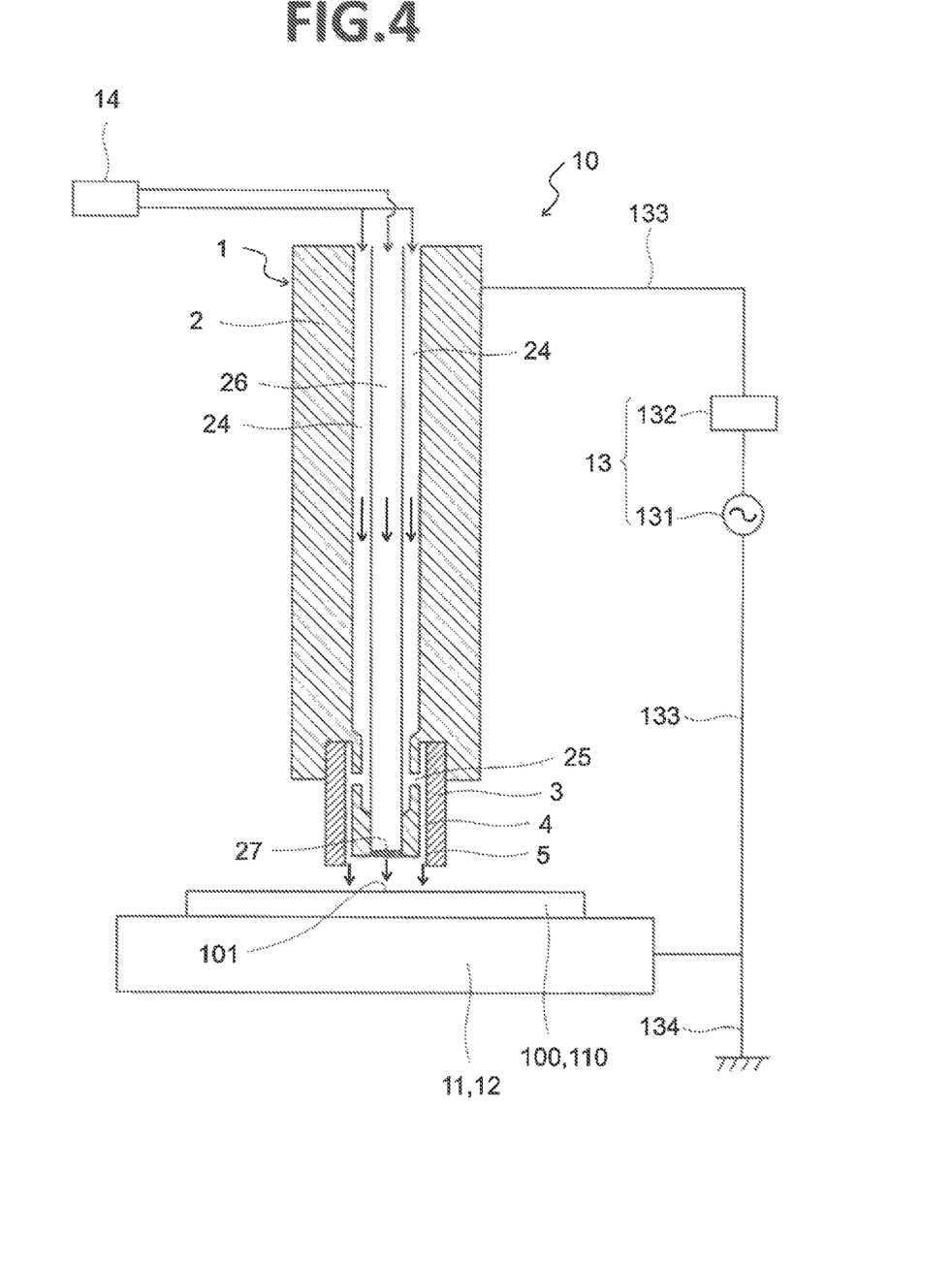
FIG. 4 is a schematic view showing the schematic configuration of an atmospheric pressure plasma generation apparatus used in the third step.

The atmospheric pressure plasma generation apparatus (below, sometimes referred to as the "apparatus") using this atmospheric pressure plasma machining will be explained next. As shown in FIG. 4, the atmospheric pressure plasma generation apparatus 10 is provided with an electrode 1, a support stand 11 which is positioned beneath of the electrode 1 and supports the workpiece 100, a counter electrode 12 which is positioned beneath the workpiece 100 facing the electrode 1, voltage applying means 13, and gas supplying means 14.

The support stand 11 may have a suction holding means for holding the workpiece 100 by suction as well. As the suction holding means, for example a vacuum chuck etc. can be mentioned.

The counter electrode 12 in the present embodiment is positioned inside the support stand 11. Further, the counter electrode 12 in the present embodiment is electrically connected through a first conductor 133 provided in the voltage applying means 13 to the electrode 1 and is grounded through a second conductor 134.

The voltage applying means 13 is a means applying voltage between the electrode 1 and the counter electrode 12. The voltage applying means 13 in the present embodiment has a high frequency power supply 131, matching device 132, the first conductor 133, and the second conductor 134.

The gas supplying means 14 is a means supplying a first process gas to a first gas inner passage 24 in an electrode part 2 and supplying a second process gas to a second gas passage 26. As the gas supplying means 14, for example, a gas tank etc. can be mentioned.

The gas supplying means 14 may have a flow rate controlling means for controlling the respective flow rates of the first process gas and the second process gas as well. Due to this, the precision of the gas flow rate can be improved, and stable processing becomes possible. As the flow rate controlling means, for example a mass flow controller can be mentioned.

Here, as the first process gas, for example, $CF_4$, $C_2F_6$, $C_3F_6$, $C_4F_8$, $CClF_3$, $SF_6$, $CHF_3$, and other fluorine atom-containing compound gases; $Cl_2$, $BCl_3$, $CCl_4$, and other chlorine atom-containing compound gases and other halogenated gases etc. may be mentioned. These may be used as single types or two types or more mixed together. Further, the first process gas may be a mixed gas of these illustrated process gases with a so-called carrier gas. "Carrier gas" means a gas which is introduced for starting discharge and maintaining discharge. As the carrier gas, for example, He, Ne, Ar, Xe, and other rare gases may be mentioned. These may be used as single types or two types or more mixed together. Further, for promoting dissociation of the process gas, $O_2$ may be mixed with the gas mixture as well. These illustrated gases can be used in a desired combination according to the workpiece 100.

The ratio of the process gas occupied in the mixed gas (mixing ratio) is not particularly limited. However, for example, the ratio of the process gas in the mixed gas may be controlled to 0.1 to 10% in flow ratio. In particular, when the ratio of the process gas in the mixed gas is controlled to 0.1 to 5% in flow ratio, the rare gas can be sufficiently excited.

The electrode part 2 has a double tube structure and is provided with, in its internal portion, a first gas inner passage 24 and a second gas passage 26 located on the inner side of the same. The first gas inner passage 24 is connected through through holes 25 to a first gas outer passage 4 formed with the tubular body 2 and leads to a first gas supply port 5. The second gas passage 26 is linked with a second gas supply port 27.

Note that, the apparatus 10 may be further provided with a moving means for relatively moving the electrode 1 and the support stand 11 in the x-axis direction, y-axis direction, and z-axis direction as well. Further, the apparatus 10 may be further provided with a suction means for applying suction to the vicinity of the plasma generation area. Due to this, surplus radicals are sucked away and thus occurrence of processing defects due to a diffusion of surplus radicals can be suppressed. Specifically, the apparatus 10 further has a cover covering the periphery of the electrode 1 and having an exhaust port. Further, a suction means for discharging gas from an exhaust port by an exhaust-use pump is formed.

Next, the third step will be explained by taking as an example a case where use is made of the atmospheric pressure plasma generation apparatus 10 explained above.

The third step is provided with the following steps (a) to (c):

(a) A step of, as shown in FIG. 4, by the gas supplying means, supplying the first process gas to the first gas inner passage 24 and supplying the second process gas to the second gas passage 26.

(b) A step of supplying the first process gas from the first gas supply port 5 to the vicinity of the periphery of one major surface 101 of the workpiece 100 which is the processed surface and supplying the second process gas from the second gas supply port 27 to one major surface 101 which is the processed surface.

(c) A step of applying a voltage between the electrode 1 and the counter electrode 12 by the voltage applying means 13 and generating atmospheric pressure plasma.

After the steps such as described above, an atmospheric pressure plasma-processed product in which one major surface 101 is precisely processed is produced.

Note that, in the step (a), the compositions of the first process gas and second process gas may be the same as or different from each other. In the same way, the flow rates of the first process gas and second process gas may be the same as or different from each other as well. As the composition and flow rate of each of the first process gas and second process gas, desired values can be employed according to the workpiece 100 so far as the atmospheric pressure plasma can be stably generated. That is, according to the present embodiment, the composition and flow rate of each of the first process gas and second process gas can be controlled, therefore highly efficient and stable machining of one major surface 101 becomes possible.

In particular, in the step (b), by supplying the first process gas from the first gas supply port 5, the first process gas forms a shield in the vicinity of the periphery of the workpiece surface 101, therefore inflow of the outside gas into the plasma generation area can be suppressed, so local processing by the atmospheric pressure plasma becomes possible. Further, by directly supplying the second process gas from the second gas supply port 27 to one major surface 101, the efficiency of generation of radicals which are reactive seeds is improved, therefore highly efficient processing of one major surface 101 by the atmospheric pressure plasma becomes possible. Note that, the first process gas functions not only for forming the shield as explained above, but also for generation of plasma. Due to the above, the first process gas may have a flow rate made larger compared with the flow rate of the second process gas in order to shut out the outside air.

In the step (c), the applied power applied between the electrode 1 and the counter electrode 12 by the voltage applying means 13 is not particularly limited so far as a generation of atmospheric pressure plasma is possible.

As such steps, the workpiece 100 can be locally processed so that the thickness becomes the desired value. In this example, the workpiece 100 is locally processed to remove material. Specifically, relative positions of the oppositely arranged pair of electrodes forming a plasma generating part and the workpiece 100 are changed while supplying the treatment gas to the surface (one major surface 101) of the workpiece 100 and applying voltage to the pair of electrodes to activate the treatment gas and generate the plasma to thereby locally and continuously etch the workpiece 100. In order to change the relative positions of the oppositely arranged pair of electrodes forming the plasma generating part and the workpiece 100, for example, the electrode 1 may be moved to scan the workpiece 100. Here, by setting the dwell time of the electrode 1 in accordance with the processing amount distribution, the desired amount of processing can be obtained.

Note that, the atmospheric pressure plasma generation apparatus 10 shown in FIG. 4 is not limited to this example. For example, in the example explained above, the electrode 1 was made a double tube structure, and the processing was carried out by using both of the first process gas and the second process gas. However, either one may be used as well. In that case, the electrode 1 may have a structure provided with only a ring-shaped process gas supply port or may have a structure provided with a process gas supply port only at the central part. Note that, according to the type of plasma to be generated (type of radical), the processing can be carried out so as to locally increase the thickness. Specifically, by not including F in the process gas and generating radicals only by $O_2$ gas, a silicon oxide film can be locally formed.

Further, the electrode 1 need not be provided with the gas supplying means 14. It may be provided with a mechanism supplying gas to a portion between the electrode 1 and the workpiece 100 as a separate body from the electrode 1 as well.

Note that, when using an LT substrate, LN substrate, GaN substrate, or sapphire substrate as the workpiece 100, local polishing may be used as well as the local processing method. By using local polishing, even difficult to process materials can be processed according to the processing amount distribution.

Here, "local polishing" means using a polishing head having an extremely small area relative to the workpiece and changing the relative positional relationship of this polishing head and the workpiece while controlling a dwell time. The relative positional relationship may be changed, for example, by making the head perform a raster scan. Specifically, the polishing head is made to perform a raster scan of the processed surface of the workpiece while controlling the dwell time so as to process the workpiece to a desired thickness distribution. Here, the dwell time at each position is determined in accordance with a polishing shape obtained in advance according to a convolution integral value of the processing shape per unit time and the dwell time. The processing shape is determined according to the material of the slurry, ending of supply, area of the polishing head, load upon the workpiece, rotation speed of the polishing head, and so on.

Second Embodiment

Before the first step in the embodiment explained above, a first etching step may also be added. The first etching step is for example aimed at a removal of residual stress of the surface or particles or other foreign substances. For this reason, in the first etching step, not a physical technique, but a chemical technique may be used as well. More specifically, a wet etching solution tailored to the material of the workpiece 100 is used to remove the layer of the surface at which residual stress remains. In order to uniformly remove such a layer, an etching solution not having anisotropy, but having isotropy may be used. Further, after performing wet etching, the substrate may be sufficiently washed in order to remove etching residue.

In particular, the first etching step may be carried out as well when using a machined member as the workpiece 100. For example, in a case of using a crystal wafer formed by slicing a raw stone of an artificial quartz crystal at a desired cutting angle by a multiwire saw etc. as the workpiece 100, residual stress remains on the surface of the workpiece 100 due to the slicing and following rough polishing or other machining. Further, sometimes abrasives and another polishing residue remains. If locally processing such a workpiece 100, sometimes the workpiece 100 will break, the crystal structure will change, and so on. In particular, when using a quartz crystal as the workpiece 100, due to existence of stress and foreign substances, sometimes cracks will formed or crystal twinning will form at the time of local processing. For this reason, the first etching step may be carried out when processing a thin crystal substrate.

Further, by reducing the residual stress of the workpiece 100, when holding the workpiece 100 on the support stand 11 by using the suction holding means in the atmospheric pressure plasma generation apparatus 10 shown in FIG. 4, the workpiece 100 can be held evenly over its entire surface. Due to this, the distance between the electrode 1 and the processed surface can be kept from deviating from the envisioned value and the magnitude of the applied voltage can be kept from deviating from the envisioned value, so the processing rate becomes uniform and as a result the processing precision rises. Further, the suction holding strength can be raised as well, therefore stable processing becomes possible. For this reason, the first etching step may be employed as well even when performing a third step of processing while held by suction on a stage.

Here, when using a quartz crystal as the workpiece 100, as the etching solution, use is made of a solution containing as a principal ingredient a buffered hydrofluoric acid made of a mixed aqueous solution of hydrofluoric acid and ammonium hydrogen fluoride. The mixing ratio of the hydrofluoric acid and ammonium hydrogen fluoride is adjusted so that the ratio of the ammonium hydrogen fluoride relative to the hydrofluoric acid becomes equimolar or less. Due to this, it is possible to make the surface roughness smaller. Further, a strong acid equimolar or less relative to the hydrofluoric acid may be further contained as well. As the strong acid, hydrochloric acid and nitric acid can be illustrated. The workpiece 100 is immersed in such an etching solution for 1 to 5 hours to remove the layer of the surface at which the residual stress remains. Here, when the residual stress of the workpiece 100 is 125 MPa, inconveniences arise such as formation of cracks and crystal twinning at the time of processing in the third step. Contrary to this, when removing the surface layer to adjust the residual stress of the workpiece 100 to 25 MPa, no inconvenience arose in the third step. In this way, in order to remove a region having such large residual stress that exceeds for example 70 MPa and adjust the thickness so as to approach the target value of thickness distribution, for example, in the first etching step, 20 μm or more may be removed.

Note that, when using an LT substrate as the workpiece 100, use is made of a nitrohydrofluoric acid as the etching solution. Specifically, a solution prepared by mixing hydrofluoric acid, nitric acid, and pure water in a 1:1:121 volume ratio can be illustrated.

Third Embodiment

After the third step in the first embodiment and second embodiment explained above, a second etching step may be provided as well. The object of the second etching step is for example to improve the surface conditions resulting from having performed the local processing. For this reason, in the second etching step, not a physical technique, but a chemical technique may be used as well. More specifically, a wet etching solution tailored to the material of the workpiece 100 is used to remove a layer of the surface. In order to uniformly remove such a layer, an etching solution not having anisotropy, but having isotropy may be used. Further, after the wet etching, the substrate may be sufficiently washed in order to remove the etching residue.

In particular, when using plasma in the third step, fine relief shapes are liable to be formed at the surface or a portion of the ingredients of the first and second process gases and carrier gas is liable to enter into the surface layer of the workpiece 100. Note that, the fine relief shapes at the surface are sufficiently small when compared with the thickness of the workpiece 100. Therefore, it is considered that the influence upon the characteristics of the element 110 is small.

Considering such a situation, the second etching step may be provided in order to remove the relief shapes and improve the local arithmetic mean roughness or remove the surface layer to remove the impurities.

Further, in the third step, when processing only one major surface 101 of the workpiece 100, a layer of the processed surface having a high stress may be removed by the second etching step as well. By the second etching step, the stress which is generated on only one of the two major surfaces of the workpiece 100 can be removed. Due to this, warping of the workpiece 100 can be suppressed. Further, when the temperature of the workpiece 100 rises in the following fourth step etc., breakage or crystal twinning due to unevenness of stress can be suppressed.

Further, the second etching step may be carried out as well when performing a third step such as processing after securing the workpiece on the stage by suction and then necessary to coat a resist etc. in a later step. If holding the workpiece 100 at the processing apparatus in the third step, sometimes dirt will attach to the surface of the workpiece 100. For example, when holding the workpiece 100 on the support stand 11 in the atmospheric pressure plasma generation apparatus 10 shown in FIG. 4 by using the suction holding means, contact with the support stand 11 occurs. Further, the surface which contacts the support stand 11 will also be formed with a conductive film in the fourth step, therefore a resist for processing the conductive film to a desired shape will also be coated on this surface. By washing off dirt which may be deposited on the surface contacting the support stand 11 to obtain a clean surface, the resist can be coated well. Further, after the second etching step, the workpiece may be washed by a sulfuric acid peroxide mixture etc. as well.

Here, when using a quartz crystal as the workpiece 100, as the etching solution, use is made of a solution containing as the principal ingredient a buffered hydrofluoric acid which is a mixed aqueous solution of hydrofluoric acid and ammonium hydrogen fluoride. The mixing ratio of the hydrofluoric acid and ammonium hydrogen fluoride is adjusted so that the ratio of the ammonium hydrogen fluoride relative to the hydrofluoric acid becomes equimolar or less. Due to this, it is possible to make the surface roughness smaller. Further, a strong acid equimolar or less relative to the hydrofluoric acid may be further contained as well. As the strong acid, hydrochloric acid and nitric acid can be illustrated. The workpiece 100 is immersed in such etching solution for 1 to 60 minutes to remove a layer of the surface.

Note that, when using an LT substrate as the workpiece 100, use is made of a nitrohydrofluoric acid as the etching solution. Specifically, a solution prepared by mixing hydrofluoric acid, nitric acid, and pure water in a 1:1:121 volume ratio can be illustrated.

In such second etching step, the dirt just on the surface may be removed and the difference of the residual stress between the two major surfaces of the workpiece 100 may be reduced to an extent where warping of the workpiece 100 no longer occurs. Specifically, it may be removed up to about 10 nm to 200 nm. The difference of residual stress between the two major surfaces of the workpiece 100 may be 10% or less or they may become almost equal.

Note that, the second etching step is carried out for a shorter time compared with the first etching step as explained above. The amount of removal (processing amount) thereof also becomes smaller.

Fourth Embodiment

In the first step in the first to third embodiments, when the workpiece 100 is made of a material or has a thickness so as to have a light transmission property, as the film-thickness measurement method, use may be made of a light interference type technique which measures the film-thickness distribution in a line shape.

Specifically, by irradiating the workpiece (irradiated body) 100 with light in a line shape and simultaneously spectrally dispersing the reflected light in a line shape, film-thickness data continuing in a line shape can be obtained. Further, by changing the relative positions of this light and the workpiece 100 and using the light to scan the entire surface in the planar direction of the workpiece 100, thickness distribution information of the entire surface can be acquired. For example, when the X-direction and the Y-direction which are perpendicular to each other are set as the planar directions, a line of light extending in the X-direction may be used to scan the surface in the Y-direction.

In this way, the film thickness can be obtained not by point measurement, but as the continuous data. Therefore, in the broad region of the surface of the workpiece 100, a desired value of thickness can be realized for each small region of each element part 103.

Here, when making the workpiece 100 quartz crystal, it is possible to use the film-thickness measurement method explained above and add corrections to achieve a higher precision. Specifically, the film-thickness distribution is acquired by going through the following three steps:

(d) A step of measuring a film-thickness candidate value by the technique of irradiating the workpiece 100 having the light transmission property with light explained above while changing the relative position with the workpiece 100 and spectrally dispersing the reflected light to thereby obtain a film-thickness candidate value.

(e) A step of measuring a reference film-thickness value for measuring the reference film thickness based on the resonance frequencies at a plurality of points of the workpiece 100.

(f) A thickness distribution determination step for correcting the film-thickness candidate value by the reference film-thickness value and obtaining the thickness distribution in the plane.

Below, the steps will be explained.

Step (d)

Figure 5:
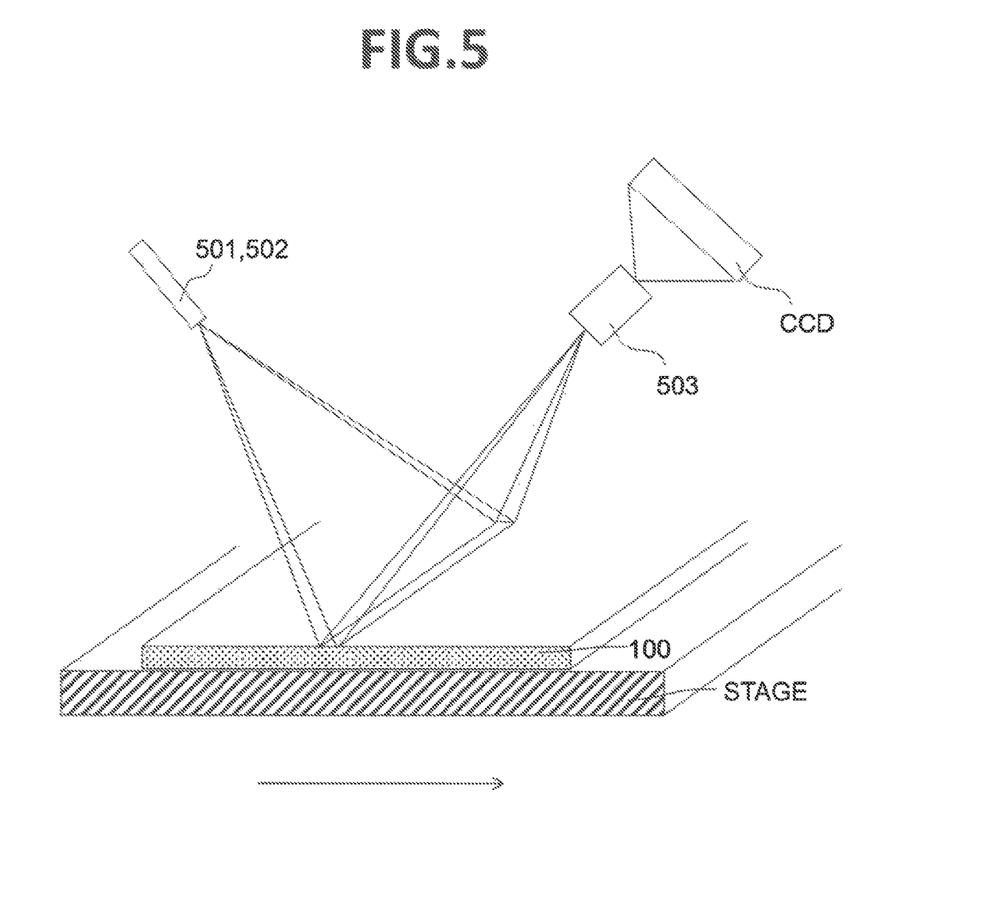
FIG. 5 is a schematic view of a film-thickness measurement apparatus.

FIG. 5 shows the schematic configuration of a light interference type film-thickness measurement apparatus 500. As shown in FIG. 5, the film-thickness measurement apparatus 500 is provided with an irradiation part 501, a light emitting part 502, and a line spectroscopic camera part 503.

The film-thickness measurement apparatus 500 changes the relative positions of the light from the irradiation part 501 and the workpiece 100 while by spectrally dispersing the reflected lights at the different positions by the line spectroscopic camera part 503 and photographing them by CCD (charge coupled device) or CMOS (complementary metal oxide semiconductor) imaging elements to obtain a two-dimensional image for each wavelength. Here, the reflected lights at the different positions exhibit interference waveforms in accordance with the thicknesses of the light irradiation positions in the workpiece 100. That is, the intensity of the light changes in accordance with a phase difference between the reflected light at the front surface of the workpiece 100 and the reflected light at the back surface of the workpiece 100, therefore a difference in brightness occurs in the reflected lights. By obtaining the distribution of light and dark at a certain specific wavelength of the reflected light as a two-dimensional image, an image reflecting the thickness distribution in the plane of the workpiece 100 is formed.

By irradiating the light in a line shape in this way and spectrally dispersing the reflected light in a line shape, compared with the measurement of point areas, the acquisition time can be greatly shortened and information continuing in the X-direction can be obtained, therefore highly precise information can be obtained. Accordingly, data having a shorter processing time, which is correct, and includes the film-thickness information can be acquired.

The irradiation part 501 which irradiates the light from the light emitting part 502 as a line shape in the X-direction may be realized by configuring the light emitting part 502 as a linear light source, using a fiber to obtain a line shape, or providing a slit between the light emitting part 502 and the workpiece 100 and limiting the light spreading from the light emitting part 502 to a line shape. This irradiation part 501 may be provided with a light beam axis control mechanism for making line shaped white light scan the surface in the Y-direction as well. In this case, the relative positions can be changed with a high precision and fine pitch. Further, in order to change the positional relationship between the light and the workpiece 100 in the Y-direction, as shown in FIG. 5, the position of the stage holding the workpiece 100 may be adjusted as well. In this case, the optical system configured by the light emitting part 502, irradiation part 501, and line spectroscopic camera part 503 can be fixed in place, therefore stable measurement can be carried out.

Here, by correctly obtaining the peak wavelength of the spectrum of the interference light from the spectral data continuing in the wavelength range of the light and acquiring the refractive index and extinction coefficient of the workpiece 100, the in-plane distribution of the film-thickness candidate values can be obtained. More specifically, the spectrum of the interference light periodically rises (vibrates) in intensity relative to the wavelength. The vibration of the intensity of the measurement value and the vibrations of the intensity of the theoretical value in certain thicknesses are fitted and the thickness having the highest fitting ratio is determined as the film-thickness candidate value. Note that, the term "periodically" does not designate only a constant period and constant amplitude.

In the example explained above, the light from the light emitting part 502 is not particularly limited. However, white light may be used as well. White light has a broad wavelength range, so there is a continuous light spectrum in that wavelength range. For this reason, it becomes possible to select the data in a wavelength suitable for material and film-thickness of the workpiece 100 from the light spectrum in the wavelength range.

Step (e)

Next, the reference film-thickness value is found from the resonance frequency. Here, the reference film-thickness value is found by point measurement. Further, correct measurement cannot be carried out in the vicinity of the outer edge part of the workpiece 100, therefore the film-thickness measurement is carried out at a few points in the workpiece 100 away from the outer edge. Note that, the step (e) may be carried out preceding the step (d) as well.

Step (f)

Next, based on the reference film-thickness value obtained in the step (e) with the coordinate information (position information) of the workpiece 100 on the XY plane, the film-thickness candidate value obtained in the step (d) is corrected.

Specifically, the film-thickness candidate value obtained in the step (d) is corrected by the following procedure. First, the spectroscopic data obtained at the step (d) becomes periodically stronger in amplitude according to the wavelength in the wavelength region of the light from the light emitting part 502. This period is a value inherent in the thickness. However, there are plurality of discrete thicknesses having the same period. This means that there are a plurality of discrete film-thickness candidate values obtained in the step (d). Here, it is possible to use the measured value obtained in the step (e), that is, the reference film-thickness value, to correct the film-thickness candidate value from the discrete film-thickness candidate values, that is, select the true film-thickness candidate value.

When using a quartz crystal as the workpiece 100, reflection from the interface between the air and the quartz crystal is confirmed. More specifically, interference light formed by a light which advances in the air and is reflected at the interface between the air and the quartz crystal and light which advances in the quartz crystal, is reflected at the bottom face of the quartz crystal, and advances to the air side, is confirmed. In this case, due to the factors of the wavelength density and the wavelength, it becomes difficult to select the true film-thickness candidate value from among discrete film-thickness candidate values by only optical computation. For this reason, when using a quartz crystal as the workpiece 100, the steps (d) to (f) may be carried out.

Further, when the thickness of the workpiece 100 is 1 μm or more, it becomes difficult to obtain the true film-thickness candidate value from among the discrete film-thickness candidate values. Therefore, the steps (d) to (f) bay be carried out. Note that, as a result of measurement of a plurality of workpieces 100 having thicknesses within a range from 1 μm to 120 μm in the step (d), a difference from the value in the step (e) was confirmed in all of them.

Figure 6A:
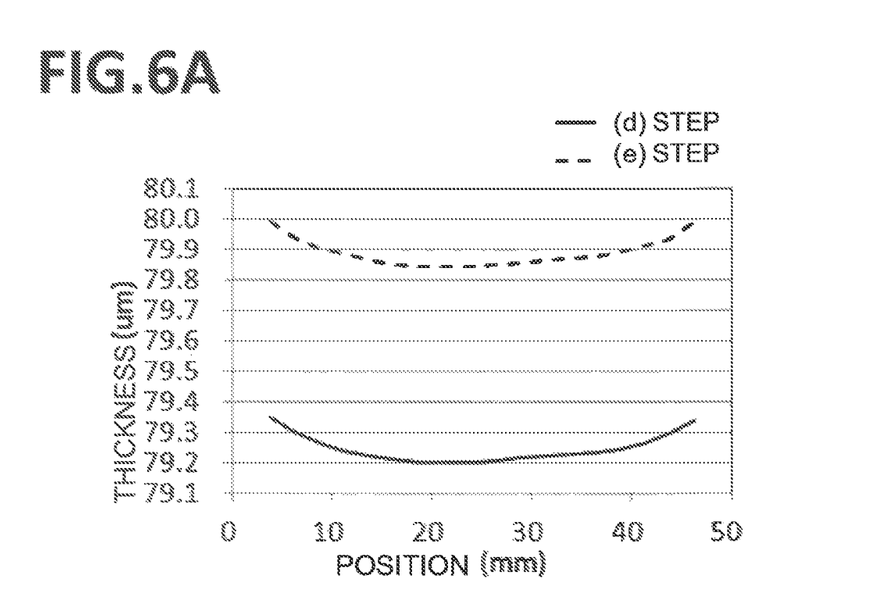
FIGS. 6A and 6B are graphs showing results of measurement of film-thickness distribution in each technique.
Figure 6B:
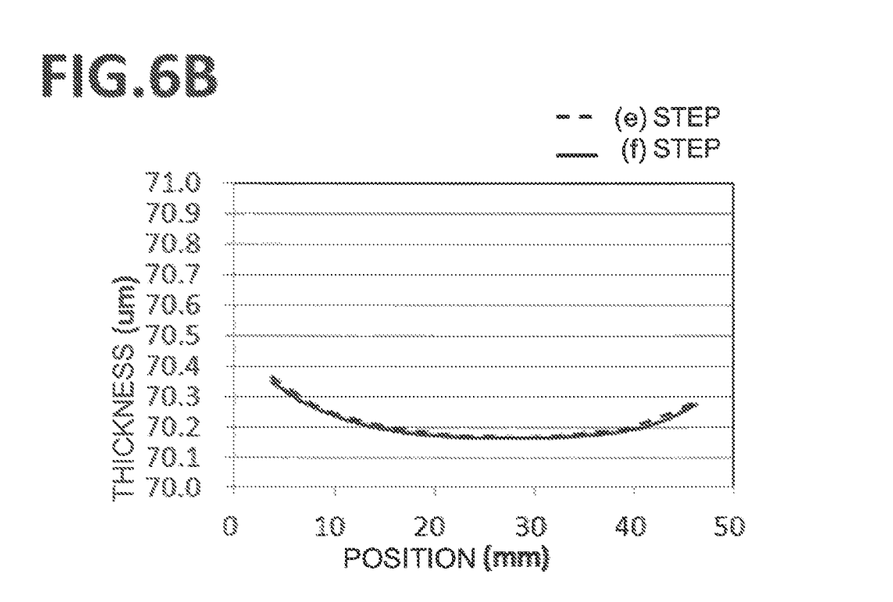

FIG. 6A shows the results of measurement of the film thickness in the case of only the step (d) and the case of only the step (e), while FIG. 6B shows the results of measurement of the film thickness when going through the steps (d) to (f).

In FIGS. 6A and 6B, the abscissa shows the positions of the workpiece 100 in one direction in the plane, and the ordinate shows the thicknesses. Note that, different objects are measured between FIG. 6A and FIG. 6B.

As apparent from FIG. 6A, according to the step (d), a relative film-thickness distribution is obtained with a high precision. However, sometimes the absolute value of film-thickness distribution cannot be obtained with a high precision. On the other hand, the absolute value of the thickness can be calculated with a high precision by the step (e). However, by only the step (e), only the average value in a diameter (about 2 to 5 mm) of the probe performing the resonance frequency measurement can be learned. The film-thickness distribution in a region smaller than the probe diameter cannot be obtained. As a result, only discrete film-thickness data can be obtained. In actuality, the information around the measurement portion is relevant, therefore the result is becomes the average thickness information within a range larger than the probe diameter. Further, in the case by only the step (e), the measurement error becomes larger in the vicinity of the outer edge of the workpiece 100. From this fact, the film-thickness distribution of the entire surface in the plane cannot be acquired. In this way, in the case by only the step (e), a film-thickness distribution continuing over the entire surface of the workpiece 100 cannot be obtained.

Contrary to this, as shown in FIG. 6B, when going through steps (d) to (f), it is confirmed that a highly precise film-thickness distribution continuing over the entire surface of the workpiece 100 is obtained.

In this way, by going through the steps (d) to (f), more correct film-thickness data can be acquired.

Note that, the steps (d) to (f) explained above were explained by taking as an example the case where the workpiece 100 is quartz crystal. However, where using an LT substrate as the workpiece 100, in place of the step (e), the reference film-thickness value may be obtained by the DEKTAK (stylus type surface profilometer) or other local film-thickness measurement technique. In particular, when arranging a thin LT substrate on a silicon, sapphire, SiC substrate, or other support substrate, if going through such steps, irrespective of waviness and outer edge parts of the support substrate, more correct film-thickness data can be acquired.

A technique for obtaining a reference film-thickness value by a technique different from the step (e) explained above will be explained. The reference film-thickness value can be obtained not only by the DEKTAK or other local film-thickness measurement method, but also from an initial set value. The initial set value can be obtained from for example film-thickness information of the LT substrate etc. before arrival at the step (e). Specifically, a target thickness obtained by subtracting from the thickness of the LT substrate etc. before bonding to the support substrate the processing thicknesses after cutting after bonding and the first etching step etc. may be made the initial set value. That is, the value obtained by subtracting the set processing amount from the initial thickness of the LT substrate may be made the initial set value.

Further, in the method explained above, the reference film-thickness value may be an appropriate film-thickness range calculated from the initial set value or the like. In that case, in a step corresponding to the step (f), a value within this film-thickness range may be selected from among the film-thickness candidate values to obtain a true thickness distribution.

Note that, in order to measure the thickness of the LT substrate or other material having optical anisotropy in the step (d), reflected light may also be made to strike the spectroscope (spectroscopic camera 503 in this example) through a polarizing plate.

Further, when selecting a material capable of correctly selecting the true film-thickness candidate value from among discrete film-thickness candidate values just by optical computation as the workpiece 100, the only step (d) may be carried out.

MODIFICATION

Example of Material

As the workpiece 100, other than quartz crystal, a glass material, inorganic material film, TFT (thin film transistor) or other thin-layer body made of organic material, oxide semiconductor including In—Ga—Zn or the like, SOS (silicon On sapphire) substrate or other composite substrate provided with an functional part, or other variations can be illustrated.

Examples of Steps

In the first to fourth embodiments, other steps may be added as well before or after the first to fifth steps, first etching step, and second etching step.

Example 1

For example, in a composite substrate comprised of a silicon, sapphire, or other support substrate on which an LT substrate is positioned, after the first etching step, an insulation film may be formed on the LT substrate. This insulation film is for example configured by $SiO_2$, $Si_3N_4$, or another insulation material film or a laminate of the same. Since an insulation film can be formed on an LT substrate relieved of stress by the first etching step, an insulation film with a small residual stress can be formed. Further, according to the first step, second step, and third step, this insulation film can be processed to one having a desired thickness distribution in the plane. By forming electrodes exciting an acoustic wave (for example IDT (interdigital transducer) electrodes) on an insulation film having a desired thickness distribution in this way, acoustic wave elements suppressing fluctuation of the frequency characteristic in the plane can be provided.

Example 2

Further, between the third step and the fourth step, a step for placing a structure covering the upper surface of the workpiece provided with the desired in-plane thickness distribution may be provided. As such example, a configuration having an intermediate layer positioned between the top of the support substrate and the structure can be illustrated. That is, first, an intermediate layer is formed on the support substrate, and then this intermediate layer is processed so as to be provided with a desired in-plane thickness distribution according to the first to third steps. As this intermediate layer, for example, an $SiO_2$, $Ta_2O_5$, AlN, or $Si_3N_4$ film or laminate of the same may be used. After adjusting the in-plane thickness distribution of the intermediate layer to a desired value in this way, the structure may be placed on the intermediate layer and electrodes may be formed on the upper surface of this structure in the fourth step.

By giving the desired thickness distribution to the intermediate layer in this way, variations in the performances of the plurality of elements formed on the same plane can be suppressed. When using an LT substrate or LN substrate as the structure, acoustic wave elements can be provided, and the frequency characteristics among the elements can be stabilized. In particular, when the structure is thin, the thickness of the intermediate layer exerts an influence upon the frequency characteristics and electrical characteristics of the elements. When using an Si substrate as the structure, semiconductor elements can be provided, and variations in the parasitic capacitance, heat dissipation, etc. when functioning as semiconductor elements can be suppressed. Note that, in addition to the intermediate layer, the first step to third step may be carried out also for the structure so that the structure have a desired thickness distribution.

Conclusion

In the examples explained above, the surfaces to be processed may differ for different steps.

Further, when forming electrodes in the fourth step, the thickness distribution of the conductive film may be corrected by the technique shown in the third step in the present disclosure. In that case, elements having more stable characteristics can be provided.

Note that, from this Description, the following separate concepts can be extracted.

(Concept 1)

A method of processing a workpiece comprising a film-thickness candidate measurement step of irradiating a workpiece having a light transmission property with light while changing the relative position relative to the workpiece and spectrally dispersing reflected light to thereby obtain a film-thickness candidate value, a reference film-thickness measurement step of measuring a reference film-thickness based on a resonance frequency at a plurality of positions of the workpiece, a film-thickness determination step of correcting the film-thickness candidate value by the reference film thickness and obtaining a thickness distribution in the plane, an etching setting step of calculating an etching amount distribution from a difference between the film-thickness distribution and a desired film-thickness distribution, and a local processing step of locally etching the substrate in accordance with the etching distribution.

(Concept 2)

A method of processing a workpiece performing wet etching before or after the local processing step in Concept 1.

REFERENCE SIGNS LIST 100 workpiece
101 first major surface
102 electrode
103 element part
104 through hole
110 element

The invention claimed is:

1. An element manufacturing method comprising:
a zeroth step of immersing a workpiece in an etching solution comprising isotropy, wherein the workpiece consists of only quartz crystal;
a first step, performed after the zeroth step, of obtaining a thickness distribution in a planar direction of the workpiece comprising a reference surface;
a second step of calculating a processing amount distribution from a difference between the thickness distribution and a desired film-thickness distribution,
a third step of locally processing the workpiece in accordance with the processing amount distribution;
a fourth step of, after the third step, dividing an inside of a plane of the workpiece into a plurality of element parts and forming an electrode in each of the element parts; and
a fifth step of making the plurality of element parts apart from each other to form a plurality of elements.

2. The element manufacturing method according to claim 1, wherein, in the third step, the processing is carried out by locally generating plasma and changing relative positions between the workpiece and a generation portion of the plasma by a dwell time in accordance with the processing amount distribution.

3. The element manufacturing method according to claim 1, further comprising, following the third step, an additional step of immersing the workpiece in a second etching solution comprising isotropy.

4. The element manufacturing method according to claim 1, further comprising:
following the third step, an additional step of immersing the workpiece in the etching solution, wherein
an etching time in the zeroth step is longer than an etching time in the additional step.

5. The element manufacturing method according to claim 1, wherein
the workpiece has a light transmission property is, and the first step comprises
a film-thickness candidate value measurement step of irradiating the workpiece with light while changing a position relative to the workpiece and spectrally dispersing reflected light to thereby obtain a film-thickness candidate value,
a reference film-thickness measurement step of measuring a reference film-thickness based on a resonance frequency at a plurality of positions of the workpiece, and
a film-thickness determination step of correcting the film-thickness candidate value by the reference film-thickness to obtain the film-thickness distribution inside the plane.

6. The element manufacturing method according to claim 5, wherein, in the film-thickness candidate value measurement step, white light is used as the light, the light is irradiated in a shape of a single line, the reflected light of the light is spectrally dispersed while maintaining the shape, and the film-thickness candidate value is obtained while maintaining the line shape.

7. An element manufacturing method comprising:
a first step of obtaining a thickness distribution in a planar direction of a workpiece comprising a reference surface, wherein the workpiece has a light transmission property;
a second step of calculating a processing amount distribution from a difference between the thickness distribution and a desired film-thickness distribution;
a third step of locally processing the workpiece in accordance with the processing amount distribution;
a fourth step of, after the third step, dividing an inside of a plane of the workpiece into a plurality of element parts and forming an electrode in each of the element parts, and a fifth step of making the plurality of element parts apart from each other to form a plurality of elements, wherein the first step comprises:

a film-thickness candidate value measurement step of irradiating the workpiece with light while changing a position relative to the workpiece and spectrally dispersing reflected light to thereby obtain a film-thickness candidate value, a reference film-thickness measurement step of measuring a reference film-thickness based on a resonance frequency at a plurality of positions of the workpiece, and a film-thickness determination step of correcting the film-thickness candidate value by the reference film-thickness to obtain the film-thickness distribution inside the plane.

8. The element manufacturing method according to claim 7, wherein, in the third step, the processing is carried out by locally generating plasma and changing relative positions between the workpiece and a generation portion of the plasma by a dwell time in accordance with the processing amount distribution.

9. The element manufacturing method according to claim 7, further comprising:

a zeroth step of immersing the workpiece in an etching solution comprising isotropy that is performed before the first step.

10. The element manufacturing method according to claim 7, further comprising, following the third step, an additional step of immersing the workpiece in a second etching solution comprising isotropy.

11. The element manufacturing method according to claim 7, wherein, in the film-thickness candidate value measurement step, white light is used as the light, the light is irradiated in a shape of a single line, the reflected light of the light is spectrally dispersed while maintaining the shape, and the film-thickness candidate value is obtained while maintaining the line shape.

12. The element manufacturing method according to claim 7, wherein the workpiece is quartz crystal.

13. The element manufacturing method according to claim 7, further comprising a zeroth step of immersing the workpiece in an etching solution comprising isotropy that is performed before the first step; and following the third step, an additional step of immersing the workpiece in the etching solution comprising isotropy, wherein an etching time in the zeroth step is longer than an etching time in the additional step.

14. An element manufacturing method comprising:

a zeroth step of immersing a workpiece in an etching solution comprising isotropy;

a first step, performed after the zeroth step, of obtaining a thickness distribution in a planar direction of the workpiece comprising a reference surface;

a second step of calculating a processing amount distribution from a difference between the thickness distribution and a desired film-thickness distribution;

a third step of locally processing the workpiece in accordance with the processing amount distribution and performing an additional step of immersing the workpiece in the etching solution;

a fourth step of, after the third step, dividing an inside of a plane of the workpiece into a plurality of element parts and forming an electrode in each of the element parts, and a fifth step of making the plurality of element parts apart from each other to form a plurality of elements, wherein an etching time in the zeroth step is longer than an etching time in the additional step.

15. The element manufacturing method according to claim 14, wherein, in the third step, the processing is carried out by locally generating plasma and changing relative positions between the workpiece and a generation portion of the plasma by a dwell time in accordance with the processing amount distribution.

16. The element manufacturing method according to claim 14, wherein the workpiece is quartz crystal.

* * * * *